(12) United States Patent
Du et al.

(10) Patent No.: US 10,886,392 B2
(45) Date of Patent: Jan. 5, 2021

(54) SEMICONDUCTOR STRUCTURE FOR IMPROVING THERMAL STABILITY AND SCHOTTKY BEHAVIOR

(71) Applicant: WIN Semiconductors Corp., Tao Yuan (TW)

(72) Inventors: Jhih-Han Du, Tao Yuan (TW); Yi Wei Lien, Tao Yuan (TW); Che-Kai Lin, Tao Yuan (TW); Wei-Chou Wang, Tao Yuan (TW)

(73) Assignee: Win Semiconductors Corp., Tao Yuan (TW)

( * ) Notice: Subject to any disclaimer, the term of this patent is extended or adjusted under 35 U.S.C. 154(b) by 126 days.

(21) Appl. No.: 16/227,557

(22) Filed: Dec. 20, 2018

(65) Prior Publication Data

US 2020/0203517 A1 Jun. 25, 2020

(51) Int. Cl.
*H01L 29/778* (2006.01)
*H01L 29/20* (2006.01)
*H01L 29/47* (2006.01)

(52) U.S. Cl.
CPC ...... *H01L 29/7783* (2013.01); *H01L 29/2003* (2013.01); *H01L 29/475* (2013.01); *H01L 29/7789* (2013.01)

(58) Field of Classification Search
CPC ............ H01L 29/7783; H01L 29/2003; H01L 29/475; H01L 29/7789
See application file for complete search history.

(56) References Cited

U.S. PATENT DOCUMENTS

| | | | |
|---|---|---|---|
| 10,084,109 B1* | 9/2018 | Du | H01L 29/42316 |
| 2010/0163929 A1* | 7/2010 | Ohki | H01L 29/7787 257/194 |
| 2012/0138956 A1* | 6/2012 | Shimizu | H01L 29/7787 257/77 |
| 2014/0239346 A1* | 8/2014 | Green | H01L 29/7787 257/192 |

* cited by examiner

*Primary Examiner* — Lex H Malsawma
(74) *Attorney, Agent, or Firm* — Muncy, Geissler, Olds & Lowe, P.C.

(57) ABSTRACT

A semiconductor structure for improving the thermal stability and Schottky behavior by engineering the stress in a III-nitride semiconductor, comprising a III-nitride semiconductor and a gate metal layer. The III-nitride semiconductor has a top surface on which a conductive area and a non-conductive area are defined. The gate metal layer is formed directly on the top surface of the III-nitride semiconductor and comprises a gate connection line and at least one gate contact extending from the gate connection line in a second direction perpendicular to the length of the gate connection line. The at least one gate contact forms a Schottky contact with the III-nitride semiconductor on the conductive area, and the gate connection line is in direct contact with the III-nitride semiconductor on the non-conductive area. The non-conductive area of the III-nitride semiconductor is at least partially covered by the gate connection line.

10 Claims, 5 Drawing Sheets

SEMICONDUCTOR STRUCTURE FOR IMPROVING THERMAL STABILITY AND SCHOTTKY BEHAVIOR

FIELD OF THE INVENTION

The present invention relates to a semiconductor structure, and more particularly to a semiconductor structure made essentially of III-nitride semiconductor and an MMIC comprising the semiconductor structure.

BACKGROUND OF THE INVENTION

The III-nitride semiconductor materials are known for their wide band gap property. For example, the GaN has the band gap of 3.4 eV, and the AlN has the band gap over 6.0 eV. This property is advantageous for the application in high-power and high-frequency MMIC (Monolithic Microwave Integrated Circuit), such as a high-power switch or a microwave power amplifier. A III-nitride semiconductor MMIC may include plural III-nitride semiconductor FETs. In a common layout, the gate contact layer of the plural III-nitride semiconductor FETs are formed in a comb-shape with plural gate contact fingers on a conductive area of the III-nitride semiconductor and a gate connection line connecting all gate contact fingers on the non-conductive area. The gate connection line is further connected to a gate contact pad through connection metal lines for input control voltage to the gate electrodes.

The III-nitride MMIC has a wide application at high temperature and high voltage. Therefore, the stability of the device performance at high temperature and high voltage is important. In a conventional III-nitride MMIC, the gate contact fingers form Schottky contact with the III-nitride semiconductor on the conductive area, and the gate connection line is formed on a dielectric layer on the non-conductive area. However, in the conventional III-nitride MMIC, the Schottky performance such as the breakdown voltage and the threshold voltage at a high applied voltage has a large variation. Moreover, the conventional III-nitride MMIC has a high leakage current in the high temperature test. In order to achieve a better high temperature and high voltage application, the Schottky behavior and the thermal stability of the III-nitride MMIC should be improved.

SUMMARY OF THE INVENTION

Accordingly, in order to solve the foregoing problem, the present invention provides a III-nitride semiconductor structure, which can effectively improve the Schottky performance at high voltage and the device reliability at high temperature by engineering the stress in a III-nitride semiconductor, thereby improving the thermal stability and Schottky behavior of the III-nitride MMIC.

To reach the objects stated above, the present invention provides a semiconductor structure for improving the thermal stability and Schottky behavior by engineering the stress in a III-nitride semiconductor, comprising a III-nitride semiconductor and a gate metal layer. The III-nitride semiconductor has a top surface on which a conductive area and a non-conductive area are defined. The gate metal layer is formed directly on the top surface of the III-nitride semiconductor and comprises a gate connection line and at least one gate contact, in which the gate connection line has a first length in a first direction and a first width in a second direction perpendicular to the first direction, and the at least one gate contact extends from the gate connection line in the second direction with a second width. The at least one gate contact forms a Schottky contact with the III-nitride semiconductor on the conductive area, and the gate connection line is in direct contact with the III-nitride semiconductor on the non-conductive area. The non-conductive area of the III-nitride semiconductor is at least partially covered by the gate connection line.

In implementation, the first width of the gate connection line is 5 to 30% of the second width of the at least one gate contact.

In implementation, the gate connection line has a width ranging from 2 to 50 μm.

In implementation, the semiconductor structure further comprises a dielectric layer provided on the gate metal layer for insulation.

In implementation, the semiconductor structure further comprises a dielectric layer provided on the gate metal layer for insulation and a conductivity metal provided on the dielectric layer for electric field suppression.

In implementation, the III-nitride semiconductor comprises a first III-nitride semiconductor layer and a second III-nitride semiconductor layer, and a conduction channel is formed between the first and second III-nitride semiconductor layers, a source contact and a drain contact form ohmic contacts with the III-nitride semiconductor on the conductive area and coupled to the conduction channel for carrying an electric current, and one of the at least one gate contact interposes between the source contact and the drain contact on the conductive area and is coupled to the conduction channel for controlling the electric current.

In implementation, the semiconductor structure is a part of an FET.

In implementation, the semiconductor structure is a part of an MMIC.

The present invention will be understood more fully by reference to the detailed description of the drawings and the preferred embodiments below.

DETAILED DESCRIPTIONS OF PREFERRED EMBODIMENTS

Figure 1:
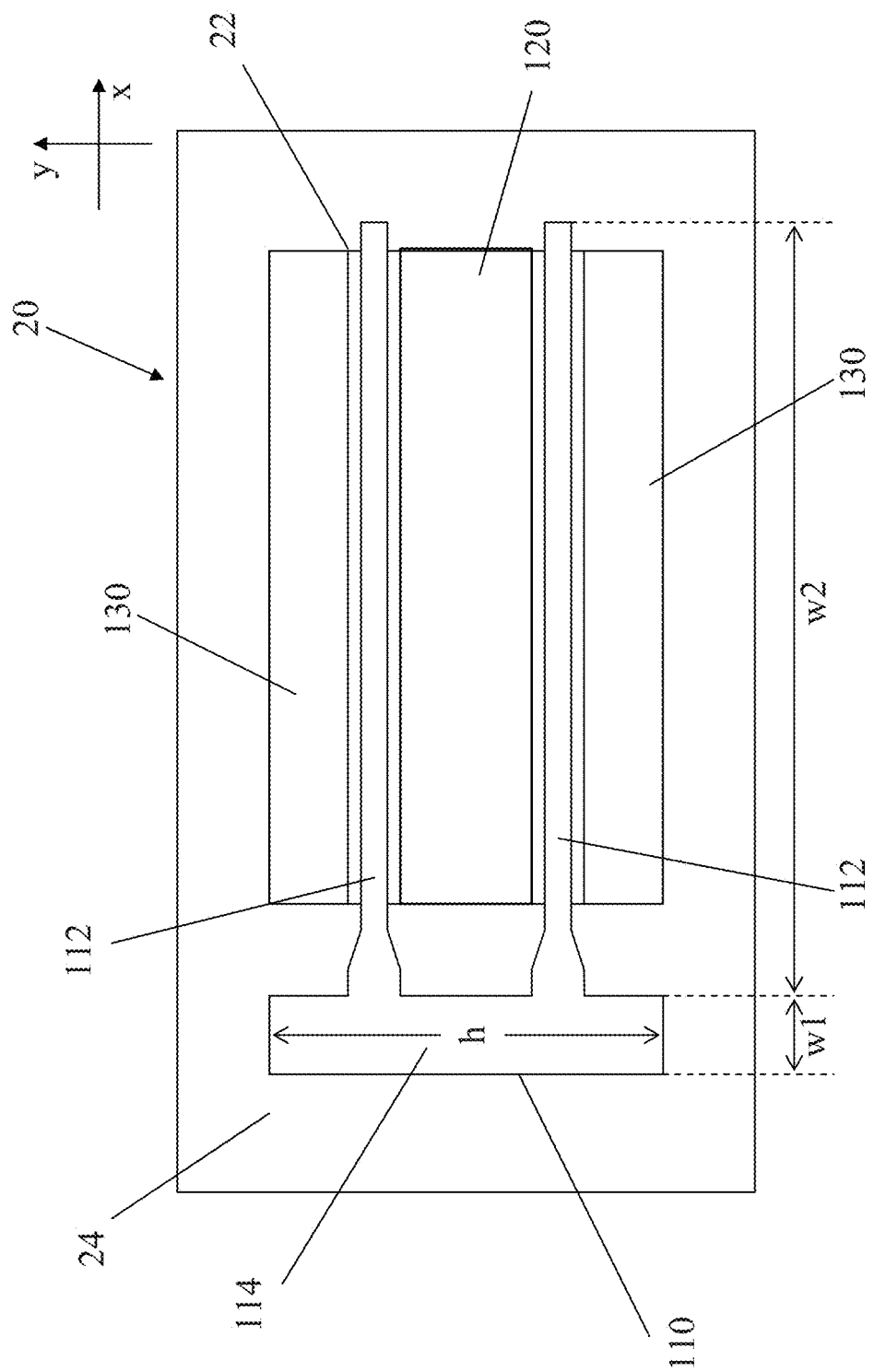
FIG. 1 is a schematic top view of an embodiment of the semiconductor structure provided by the present invention.

FIG. 1 is a schematic top view of an embodiment of a semiconductor structure provided by the present invention, which comprises: a III-nitride semiconductor 20 and a gate metal layer 110. The III-nitride semiconductor 20 has a top surface on which a conductive area 22 and a non-conductive area 24 are defined. The gate metal layer 110 is formed directly on the top surface of the III-nitride semiconductor 20 and comprises a gate connection line 114 and at least one gate contact 112. The gate connection line 114 has a first length h in a first direction along the y-axis and a first width w1 in a second direction along the x-axis perpendicular to the first direction, and the at least one gate contact 112 extends from the gate connection line 114 in the second direction with a second width w2. The at least one gate contact 112 forms a Schottky contact with the III-nitride semiconductor 20 on the conductive area 22, and the gate connection line 114 is in direct contact with the III-nitride semiconductor 20 on the non-conductive area 24. The non-conductive area 24 of the III-nitride semiconductor 20 is at least partially covered by the gate connection line 114.

Figure 2:
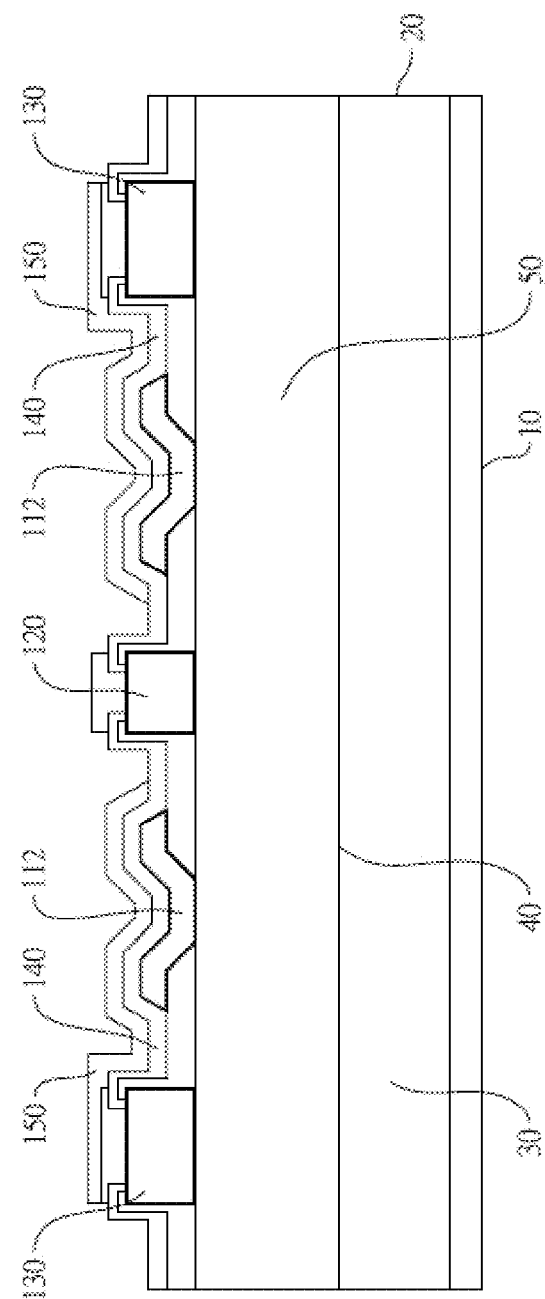
FIG. 2 is a schematic side view of an embodiment of the semiconductor structure provided by the present invention.

In one embodiment, an FET comprises the semiconductor structure provided by the present invention. The FET comprises a III-nitride semiconductor 20 formed on a substrate 10. As shown in FIG. 2, the III-nitride semiconductor 20 comprises a first III-nitride semiconductor layer 30 and a second III-nitride semiconductor layer 50, and a conduction channel 40 is formed between the first and second III-nitride semiconductor layers 30 and 50, a source contact 130 and a drain contact 120 form ohmic contacts with the III-nitride semiconductor 20 on the conductive area 22 and coupled to the conduction channel 40 for carrying an electric current, and a gate contact 112 interposes between the source contact 130 and the drain contact 120 on the conductive area 22 and is coupled to the conduction channel 40 for controlling the electric current.

In one embodiment of the fabrication process of the semiconductor structure, after the source contact 130 and drain contact 120 forming ohmic contacts with the III-nitride semiconductor 20, the conductive area 22 of the III-nitride semiconductor 20 is masked and an ion implantation process is performed on the III-nitride semiconductor 20. The crystal structure of the III-nitride semiconductor 20 in the uncovered area is damaged by the impinging ions and becomes insulated, thereby forming the non-conductive area 24. A gate contact area is formed on the conductive area 22 interposing between the source contact 130 and the drain contact 120. A gate metal layer 110 comprising plural gate contact 112 and a gate connection line 114 is deposited on the top surface of the III-nitride semiconductor 20, in which the plural gate contact 112 are deposited on the conductive area 22 and form Schottky contacts with the III-nitride semiconductor 20, and the gate connection line 114 which connects the plural gate contact 112 is deposited directly on the non-conductive area 24.

In one embodiment, the non-conductive area 24 of the III-nitride semiconductor 20 is at least partially covered by the gate connection line 114. In one embodiment, the first width w1 of the gate connection line 114 is 5 to 30% of the second width w2 of the at least one gate contact 112. In one embodiment, the gate connection line 114 has a width preferably ranging from 2 to 50 μm, or more preferably ranging from 10 to 35 μm. The gate connection line 114 to conductive area 22 has a distance preferable ranging from 3 to 30 μm, or more preferable ranging from 5 to 20 μm.

In one embodiment, a dielectric layer 140 is provided on the gate metal layer and substantially covers the entire gate metal layer for insulation. The dielectric layer 140 can be made of any dielectric material, preferably of SiN. In one embodiment, a conductivity metal 150 is provided on the dielectric layer 140 for electric field suppression.

In one embodiment, the first III-nitride semiconductor layer comprises GaN. In one embodiment, the second III-nitride semiconductor layer comprises AlGaN, InAlN, AlN, or GaN.

Figure 3:
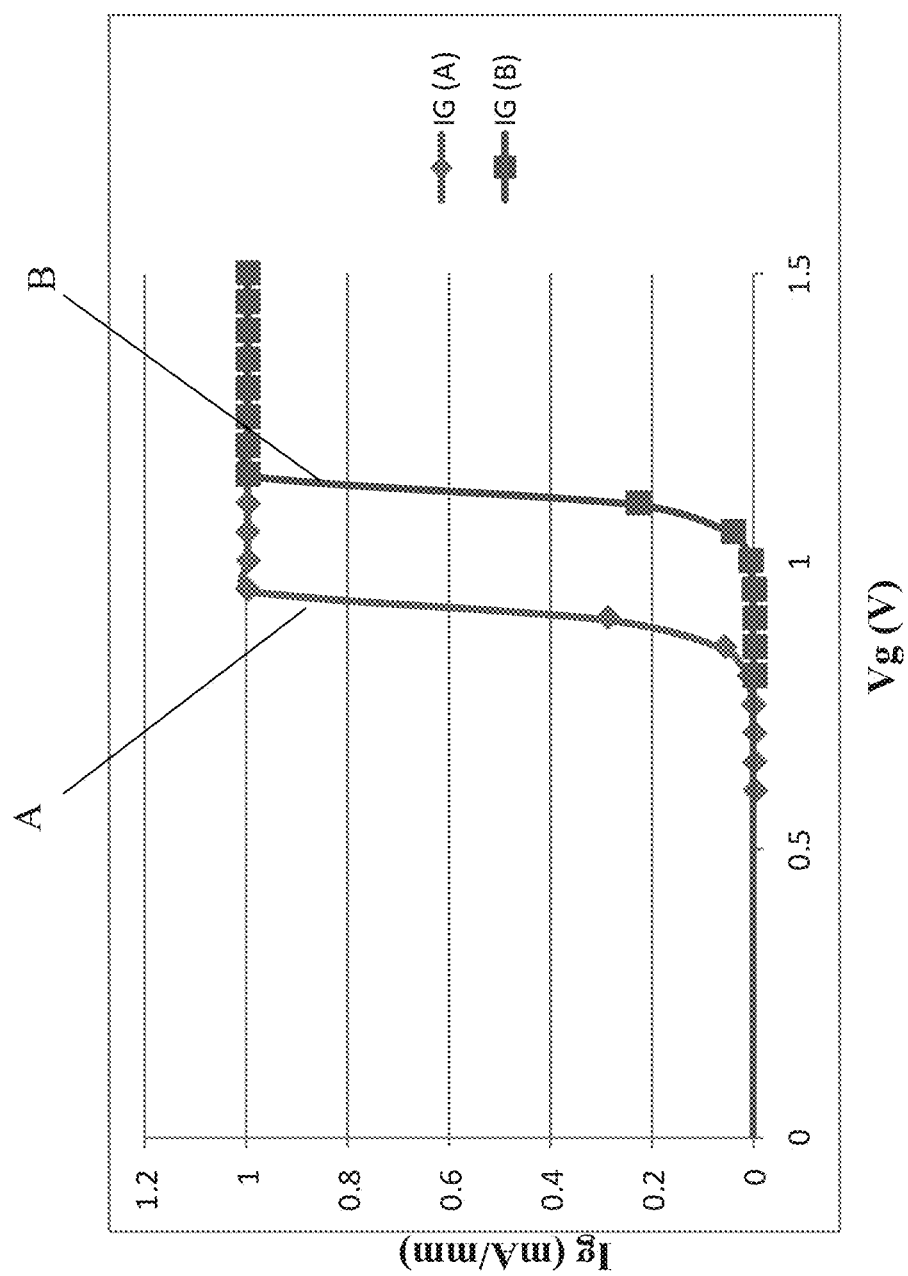
FIG. 3 shows a graph of I-V curves measured on the gate electrodes in a prior art power cell (line A) and a power cell provided by the present invention (line B).

The semiconductor structure provided by the present invention may improve the stress in the non-conductive area, thereby improving the thermal stability and Schottky behavior. The MMIC provided by the present invention shows improved electrical properties than a prior art MMIC. In one embodiment, the MMIC is a power cell including plural FETs devices made on the semiconductor structure provided by the present invention. FIG. 3 shows I-V curves measured on the gate electrodes in a prior art power cell (line B) and a power cell provided by the present invention (line A). As shown in the figure, the turn-on voltage Von of the gate electrode in the MMIC of the present invention is higher than the Von in the prior art MMIC. The Schottky behavior of the gate electrode is improved in the present invention.

Figure 4A:
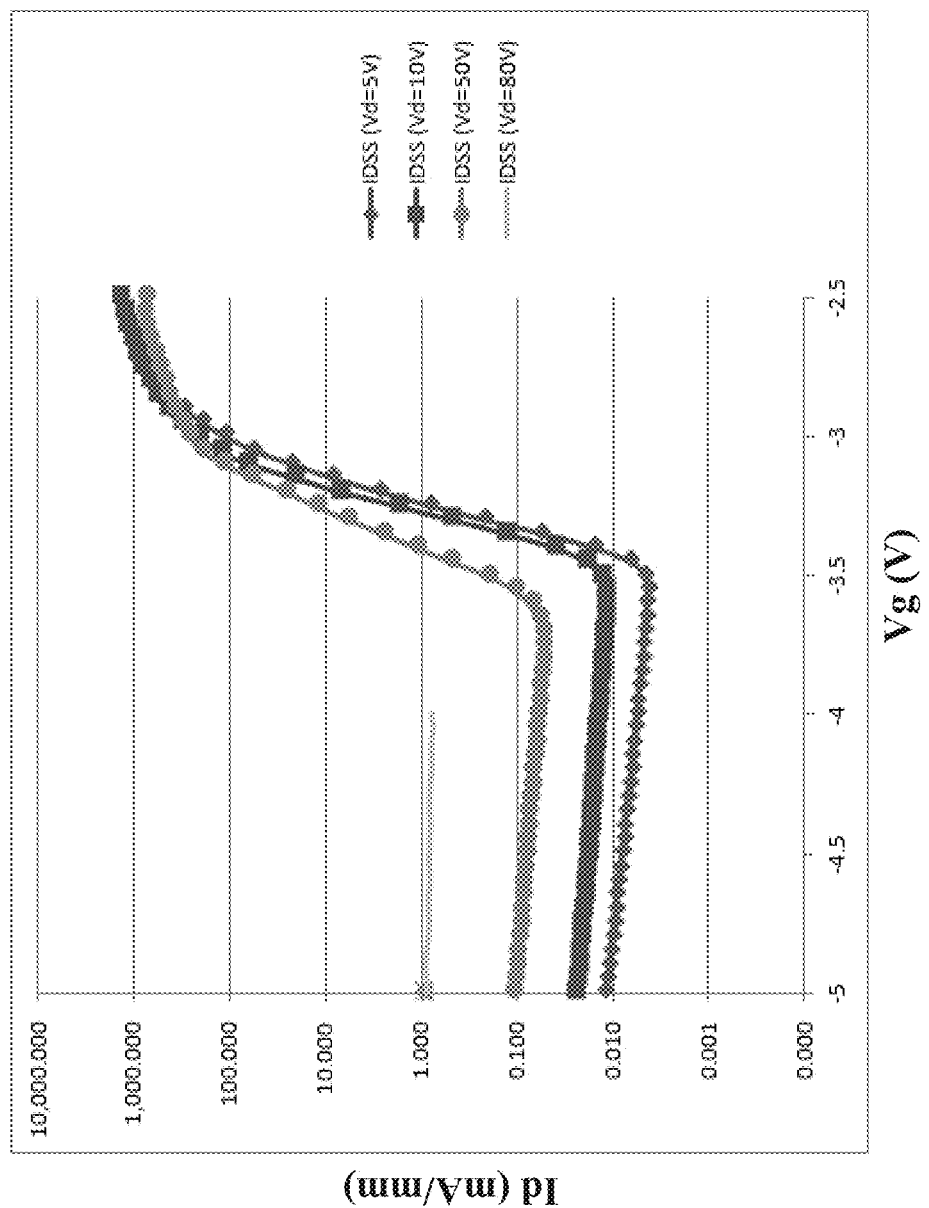
FIGS. 4A and 4B respectively show a graph of I-V curves measured in the prior art MMIC (4A) and in MMIC of the present invention (4B) at an off state.
Figure 4B:
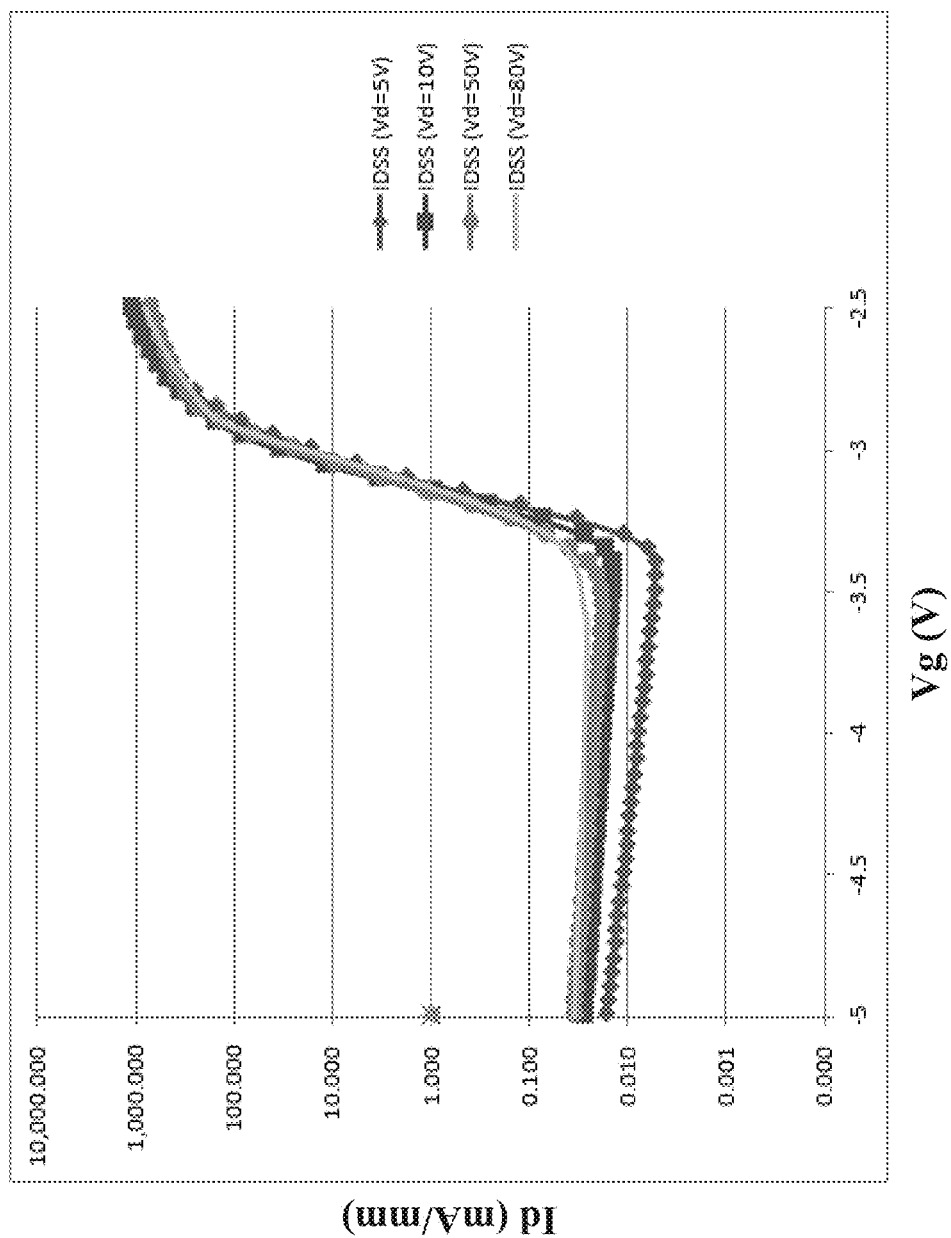

FIGS. 4A and 4B respectively show the I-V curves measured on the drain electrodes in the prior art MMIC and in the MMIC of the present invention at an on state. The I-V curves are measured under a variety of applied drain voltage. In the IV-curves of the prior art MMIC, the threshold voltage shift up as the applied drain voltage increased, whereas in the MMIC of the present invention, the threshold voltage remains mostly at the same level even under high applied drain voltage.

The device thermal stability is also improved with the semiconductor structure provided by the present invention. In a thermal stability test, a device provided by the present invention and a prior art device is tested under high temperature and high reverse bias conditions. The variation of the threshold voltage of the devices provided by the present invention is less than 5% over 25 hours during the high temperature test, while the prior art devices are mostly degraded under the high temperature with a failure rate larger than 90%.

Accordingly, the present invention has the following advantages:

1. In the MMIC provided by the present invention, the turn-on voltage of the gate electrode is higher, the leakage current is smaller. The overall Schottky behavior of the III-nitride MMIC provided by the present invention is improved.

2. In the MMIC provided by the present invention, the threshold voltage remains at the same level at high voltage. The stability of Schottky performance of the III-nitride MMIC provided by the present invention at high voltage is improved.

3. The threshold voltage of the III-nitride MMIC provided by the present invention has a small variation over a long test period at high temperature. The thermal stability of the III-nitride MMIC provided by the present invention is improved.

4. The gate contact and the gate connection line of the semiconductor structure provided by the present invention are formed in the same fabrication step. The fabrication process of the III-nitride semiconductor structure is therefore simplified.

To sum up, the semiconductor structure provided by the present invention can indeed meet its anticipated objective to effectively improve the Schottky performance at high voltage and the device reliability at high temperature, thereby improving the thermal stability and Schottky behavior of the III-nitride MMIC.

The description referred to in the drawings and stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A semiconductor structure for improving the thermal stability and Schottky behavior by engineering the stress in a III-nitride semiconductor, comprising:

a III-nitride semiconductor having a top surface on which a conductive area and a non-conductive area are defined; and a gate metal layer formed directly on the top surface of III-nitride semiconductor comprising a gate connection line and at least one gate contact, wherein the gate connection line has a first length in a first direction and a first width in a second direction perpendicular to the first direction, and the at least one gate contact extends from the gate connection line in the second direction with a second width, wherein the at least one gate contact forms a Schottky contact with the III-nitride semiconductor on the conductive area, and the gate connection line is in direct contact with the III-nitride semiconductor on the non-conductive area, wherein the non-conductive area of the III-nitride semiconductor is at least partially covered by the gate connection line, and wherein the first width of the gate connection line is 5 to 30% of the second width of the at least one gate contact.

2. The semiconductor structure according to claim 1, wherein the gate connection line has a width ranging from 2 to 50 μm.

3. The semiconductor structure according to claim 1, where in the gate connection line to the conductive area has a distance ranging from 3 to 30 μm.

4. The semiconductor structure according to claim 1, wherein the III-nitride semiconductor comprises a first III-nitride semiconductor layer and a second III-nitride semiconductor layer, and a conduction channel is formed between the first and second semiconductor III-nitride semiconductor layers, a source contact and a drain contact form ohmic contacts with the III-nitride semiconductor on the conductive area and coupled to the conduction channel for carrying an electric current, and one of the at least one gate contact interposes between the source contact and the drain contact on the conductive area and is coupled to the conduction channel for controlling the electric current.

5. The semiconductor structure according to claim 4, wherein the first III-nitride semiconductor layer comprises GaN.

6. The semiconductor structure according to claim 4, wherein the second III-nitride semiconductor layer comprises AlGaN, InAlN, AlN, or GaN.

7. The semiconductor structure according to claim 6, further comprising a conductivity metal provided on the dielectric layer for electric field suppression.

8. The semiconductor structure according to claim 1, further comprising a dielectric layer provided on the gate metal layer for insulation.

9. The semiconductor structure according to claim 1, wherein the semiconductor structure is a part of an FET.

10. The semiconductor structure according to claim 1, wherein the semiconductor structure is a part of an MMIC.

* * * * *